United States Patent
Kroeker et al.

[11] Patent Number: 6,095,741
[45] Date of Patent: Aug. 1, 2000

[54] DUAL SIDED SLOT VALVE AND METHOD FOR IMPLEMENTING THE SAME

[75] Inventors: Tony R. Kroeker, Georgetown; Benjamin W. Mooring, Austin, both of Tex.; Nicolas J. Bright, San Jose, Calif.

[73] Assignee: Lam Research Corporation, Fremont, Calif.

[21] Appl. No.: 09/280,177

[22] Filed: Mar. 29, 1999

[51] Int. Cl.[7] .............................. B65G 49/07; F16K 3/10
[52] U.S. Cl. ....................... 414/217; 414/805; 414/939; 251/193
[58] Field of Search .................... 414/217, 939, 414/935, 805; 251/193, 187, 158; 137/614.21; 49/216, 209

[56] References Cited

U.S. PATENT DOCUMENTS

| | | | |
|---|---|---|---|
| 3,789,875 | 2/1974 | McGee | 137/553 |
| 4,340,462 | 7/1982 | Koch | 204/298 |
| 4,355,937 | 10/1982 | Mack et al. | 414/217 |
| 4,483,654 | 11/1984 | Koch et al. | 414/744 |
| 4,593,915 | 6/1986 | Seger et al. | 277/12 |
| 4,715,764 | 12/1987 | Hutchinson | 414/217 |
| 4,715,921 | 12/1987 | Maher et al. | 156/345 |
| 4,721,282 | 1/1988 | Shawver et al. | 251/193 |
| 4,747,577 | 5/1988 | Dimock | 251/193 |
| 4,753,417 | 6/1988 | Madocks et al. | 251/158 |
| 4,795,299 | 1/1989 | Boys et al. | 414/217 |
| 4,804,086 | 2/1989 | Grohrock | 206/328 |
| 4,917,556 | 4/1990 | Stark et al. | 414/217 |
| 5,002,255 | 3/1991 | Sawa et al. | 251/193 |
| 5,076,205 | 12/1991 | Vowles et al. | 414/401 |
| 5,100,276 | 3/1992 | Iwasaki et al. | 414/222 |
| 5,120,019 | 6/1992 | Davis, Jr. | 251/193 |
| 5,150,882 | 9/1992 | Kaneko | 251/193 |
| 5,292,393 | 3/1994 | Maydan et al. | 156/345 |
| 5,383,338 | 1/1995 | Bowsky et al. | 62/125 |
| 5,562,800 | 10/1996 | Kawamura et al. | 156/643.1 |
| 5,667,197 | 9/1997 | Boyd et al. | 251/193 |
| 5,697,749 | 12/1997 | Iwabuchi et al. | 414/217 |
| 5,769,952 | 6/1998 | Komino | 251/193 |
| 5,902,088 | 5/1999 | Fairbairn et al. | 414/217 |

FOREIGN PATENT DOCUMENTS

| | | | |
|---|---|---|---|
| 591085 | 6/1994 | European Pat. Off. | H01L 21/00 |
| 1093854 | 5/1984 | India | F16K 3/18 |
| WO 92/02950 | 2/1992 | WIPO | H01L 21/00 |

*Primary Examiner*—Steven A. Bratlie
*Attorney, Agent, or Firm*—Martine Penilla & Kim, LLP

[57] ABSTRACT

A dual sided slot valve is in a vacuum body between adjacent process and transport modules. Separate valves are provided for each of two valve body slots, one body slot being separately closed or opened independently of the other. The separate valves allow a vacuum in the transport module while an adjacent process module is open to the atmosphere for servicing. The valve allows access to an open valve for servicing the open valve in that one actuator motor stops the valve in an open, but not vertically-spaced, position relative to the respective slot. The open valve is more easily reached by a gloved hand of a service worker. A separate actuator motor moves the valve vertically down from the open position and away from the slot to expose the sealing surface around the slot for cleaning. The vertical distance of the vertically-moved valve from an access opening makes it difficult for the worker's glove to reach the valve for service. However, in the vertically-moved position the valve does not interfere with the ability to clean around the valve door. The dual sided slot valves are offset relative to each other to reduce the distance occupied by the valve body between the adjacent transport and process modules.

18 Claims, 11 Drawing Sheets

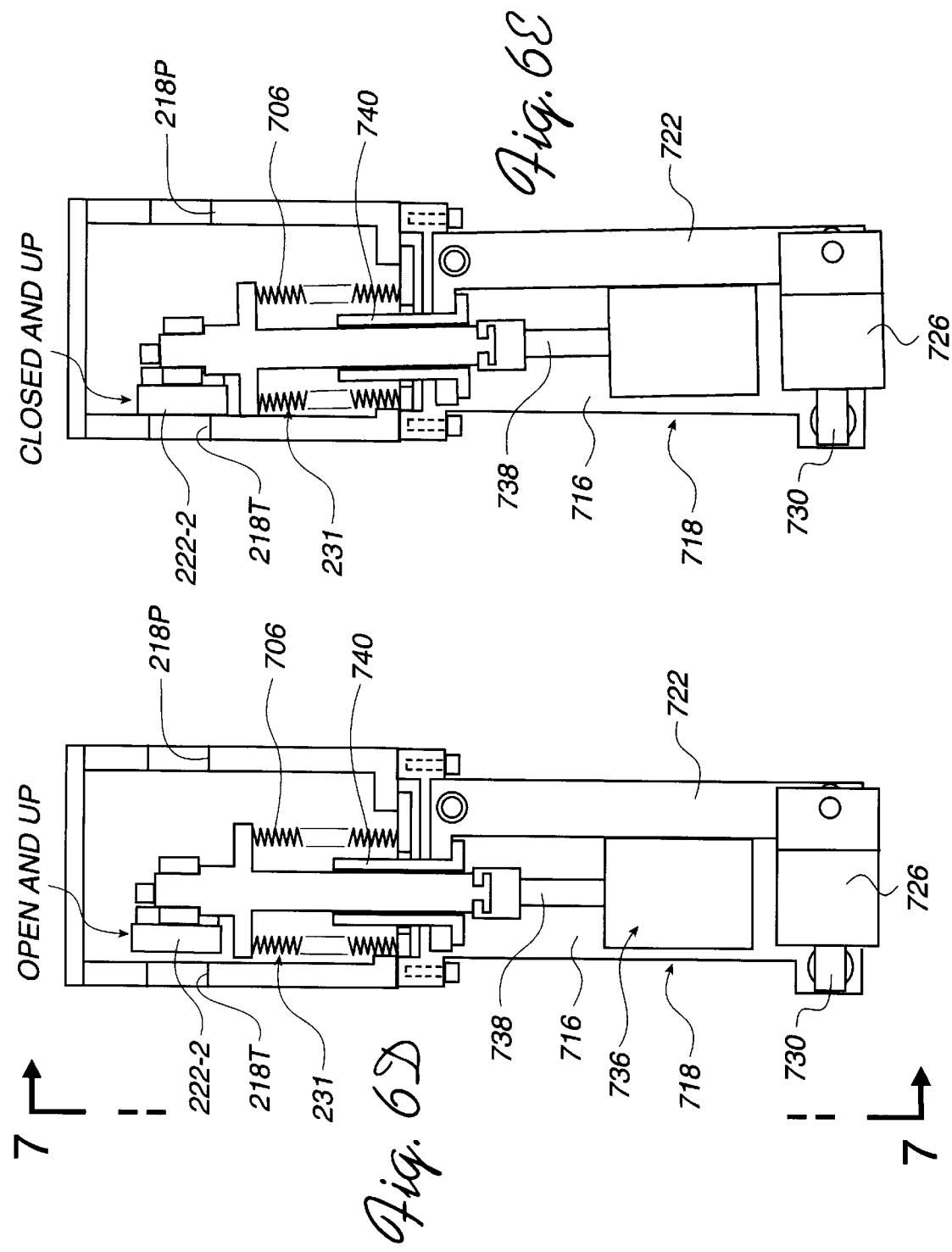

DUAL SIDED SLOT VALVE AND METHOD FOR IMPLEMENTING THE SAME

BACKGROUND OF THE INVENTION

1. Field of the Invention

The present invention relates generally to valves for modules of semiconductor processing equipment, and more particularly to dual sided slot valves and methods of implementing such valves between separate chambers of semiconductor processing equipment so that operations may continue in one chamber during servicing of the other chamber.

2. Description of the Related Art

In the manufacture of semiconductor devices, process chambers are interfaced to permit transfer of wafers, for example, between the interfaced chambers. Such transfer is via transport modules that move the wafers, for example, through slots or ports that are provided in the adjacent walls of the interfaced chambers. For example, transport modules are generally used in conjunction with a variety of substrate processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of transport modules which operate as an intermediate handling apparatus (typically maintained at a reduced pressure, e.g., vacuum conditions). By way of example, a transport module may be physically located between one or more clean room storage facilities where substrates are stored, and multiple substrate processing modules where the substrates are actually processed, e.g., etched or have deposition performed thereon. In this manner, when a substrate is required for processing, a robot arm located within the transport module may be employed to retrieve a selected substrate from storage and place it into one of the multiple processing modules.

As is well known to those skilled in the art, the arrangement of transport modules to "transport" substrates among multiple storage facilities and processing modules is frequently referred to as a "cluster tool architecture" system. FIG. 1 depicts a typical semiconductor process cluster architecture 100 illustrating the various chambers that interface with a transport module 106. Transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to transport module 106 is a load lock 104 that may be implemented to introduce substrates into transport module 106. Load lock 104 may be coupled to a clean room 102 where substrates are stored. In addition to being a retrieving and serving mechanism, load lock 104 also serves as a pressure-varying interface between transport module 106 and clean room 102. Therefore, transport module 106 may be kept at a constant pressure (e.g., vacuum), while clean room 102 is kept at atmospheric pressure. To prevent leaks between modules during pressure varying transitions, or to seal off a processing module from transport module 106 during processing, various types of gate drive valves are used to isolate the various modules.

For more information on gate drive valves, reference may be made to U.S. Pat. No. 4,721,282, which is hereby incorporated by reference. Another such gate drive valve is shown in U.S. Pat. No. 5,667,197, in which a prior art valve housing is shown having two port openings, and only one valve for one of the two port openings. Thus, it is not possible to close each of the two ports at the same time, nor to close only the port that does not have an associated valve. Also, the gate plate valve of the '282 Patent is shown for closing a port between abutting transport and process chambers, and no intermediate valve housing is provided. A drive assembly for the gate plate moves the gate plate in one continuous motion in a vertical path and in a rotating arc toward the internal port to effect a seal or closure of the internal port.

U.S. Pat. No. 5,150,882 shows one valve between various chambers of a treatment system, including between a decompression chamber and an etching chamber. Such one valve is driven for engagement and disengagement with a gate aperture by one air cylinder and a toggle arrangement such that stopper plates hit rollers with considerable impact. Initial vertical movement of a fitting plate is changed to horizontal movement by the link that is rotated counterclockwise, such that the gate moves toward the gate aperture. For the '882 Patent to avoid problems of the prior art, the stopper plates are made from a double boride hard alloy. Further, the single motion of the one air cylinder is not stopped, but instead continues its driving operation after the abutment of the stopper plates with the rollers. Thus, in addition to requiring special materials, the '882 Patent does not provide two valves between adjacent processing chambers.

In view of the forgoing, what is needed is a valve assembly between adjacent process or transport chambers, wherein operations in one such chamber may continue while servicing, for example, is performed in the other chamber.

SUMMARY OF THE INVENTION

Broadly speaking, the present invention fills these needs by providing a dual sided slot valve in a housing between adjacent process chambers. Separate valves are provided for each of two valve housing ports or slots, such that a housing port and a mating port of the process chambers or transport chambers, for example, may be separately closed or opened independently of the other cooperating housing port and process chamber port. The separate valves facilitate maintaining a vacuum, for example, in a transport chamber while an adjacent process chamber is opened to the atmosphere to allow servicing to be performed. As a result, substantial periods of downtime are avoided in that no pump down cycle is needed to bring the transport chamber to a desired vacuum after servicing the process chamber, and no other operations need be performed on the transport chamber due to the servicing of the process chamber.

Also, with the transport chamber at vacuum, and with the port to the process chamber closed by a valve door next to the transport chamber, corrosive gases and plasma in the process chamber do not contaminate the transport chamber and the valve door next to the transport chamber is not subject to etching in response to materials in the process chamber. Thus, in general, only the valve door next to the process chamber need be replaced during servicing after it becomes corroded, and the transport chamber may remain at vacuum during such replacement. Finally, the other valve door between the valve and the process chamber reduces the corrosion of the bellows and other parts of the valve.

Further, the dual sided slot valve is provided with these advantages while initially allowing easy access to an open valve for performing service on the valve. Such easy access is provided by one drive which stops the valve in an open, but not laterally-spaced (i.e., not vertically-spaced), position relative to the port. In this open position the valve may be reached by a gloved hand of a worker for service. A separate drive then functions to move the valve laterally away from the open position and away from the port to expose the sealing surface around the port, which permits cleaning of the sealing surface, for example. Due to the vertical distance between the laterally-moved valve and an access opening which is normally closed by a lid, it is generally difficult for the protective glove of the worker to reach the valve for service after the vertical movement. In the vertically-moved position, however, the valve does not interfere with the ability to clean around the valve door, including the surface against which the door seals. Additionally, the actuator shafts for each of the slot valve doors may be positioned relative to each other in an offset manner so as to reduce the clean room real estate occupied by the valve housing between the adjacent transport and process chambers, for example.

It may be understood, then, that while normal operations continue in one chamber of two adjacent chambers, many types of servicing may be performed in the other of the two chambers. Such servicing may, for example, include removing broken pieces of wafers from a chamber or valve housing, cleaning the sealing surface of a port, cleaning the interior of a chamber, and removing and replacing a member of a valve (e.g., a door or an O-ring) that effects the seal with the sealing surface. These and other operations for maintaining such chambers in normal operation for semiconductor processing, for example, are referred to herein as "servicing," or "service."

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 6D is a schematic view of the one dual sided slot valve of the present invention showing the actuator including an open/close air cylinder which rotates a cradle on a pivot plate to move the door into the OPEN or the CLOSED position, wherein the actuator also includes an up/down air cylinder which moves the door relative to the cradle in the OPEN position to align the door with the slot or move the door below the slot.

FIG. 6E is a schematic view similar to FIG. 6D showing the up/down air cylinder having moved the door relative to the cradle in the OPEN position to align the door with the slot, and the open/close air cylinder then having rotated the cradle on the pivot plate to move the door into the CLOSED position to seal the slot closed.

DETAILED DESCRIPTION OF THE PREFERRED EMBODIMENTS

An invention is described for assuring that operations may continue in one module of a semiconductor process cluster architecture during servicing of another module. The invention is described in terms of valves for modules of semiconductor processing equipment, and more particularly to dual sided slot valves and methods of implementing such valves in separate modules of semiconductor processing equipment. It will be obvious, however, to one skilled in the art, that the present invention may be practiced without some or all of these specific details. In other instances, well known process operations have not been described in detail in order not to obscure the present invention.

Figure 1:
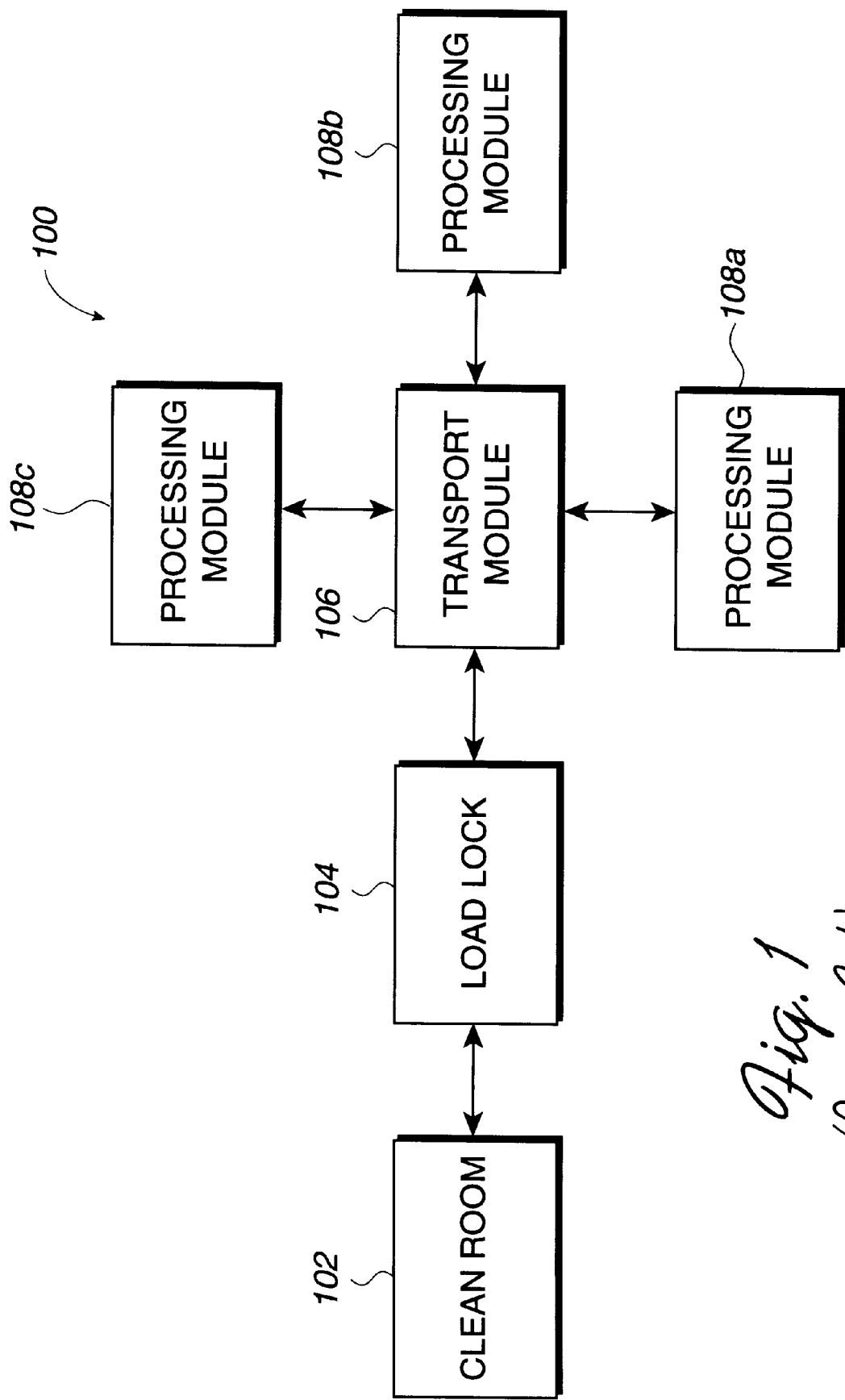
FIG. 1 depicts a typical prior art semiconductor process cluster architecture illustrating various chambers that interface with a transport module, wherein a single door valve is in one chamber or the module such that the chamber and module each must be shut down to enable servicing of either of the them.
Figure 2:
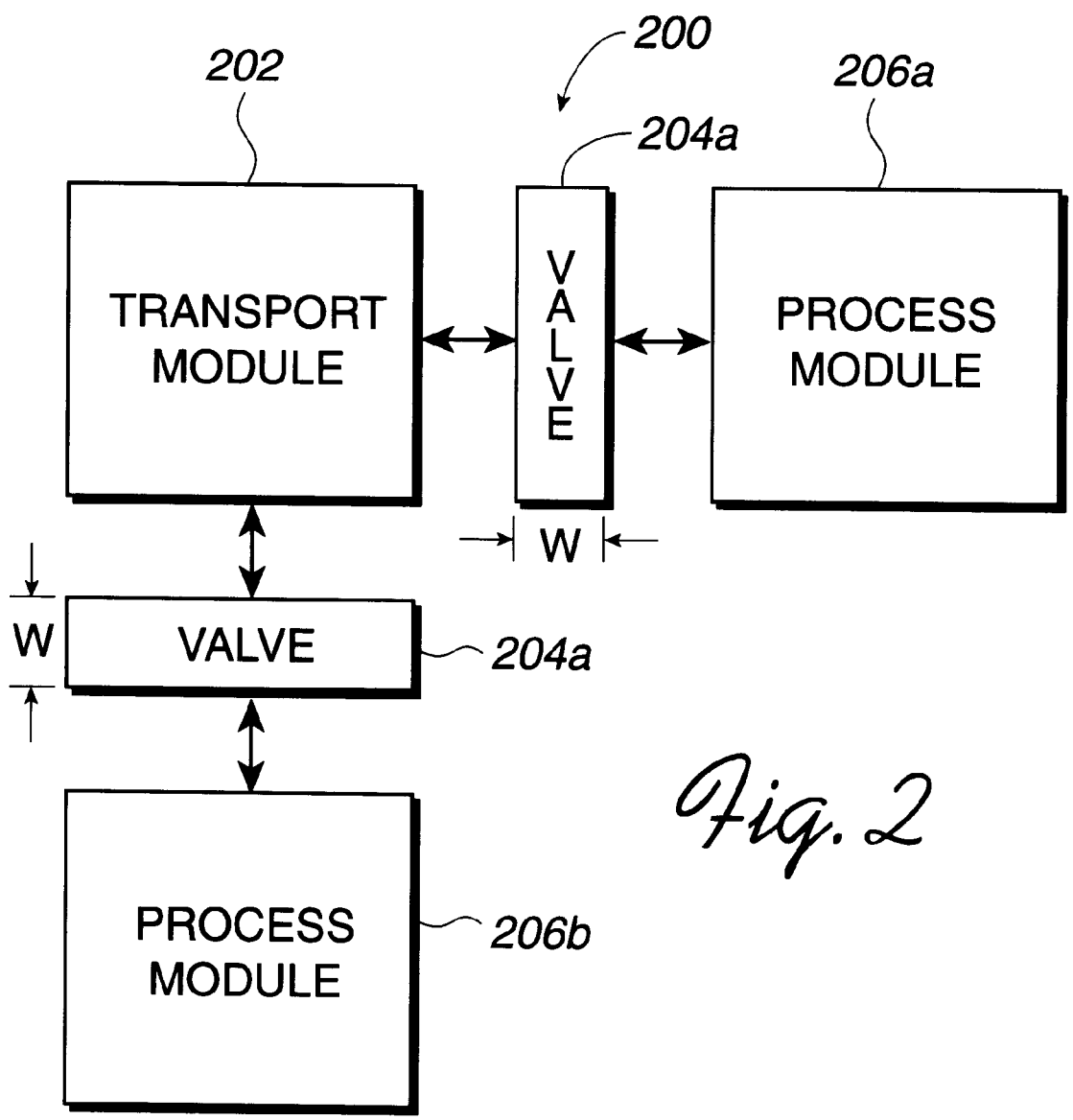
FIG. 2 depicts a dual sided slot valve of the present invention located between adjacent ones of the transport module and a process module, wherein two door valves are in a valve vacuum body of a valve housing between the transport and process modules, such that only a selected one of the modules need be shut down to enable servicing of the selected one of them.

Referring to FIG. 2, the invention is generally described as including a semiconductor process cluster architecture 200 having a transport module 202 and a process module 206a, wherein a dual sided slot valve 204a is located between adjacent ones of the transport module 202 and the process module 206a. Considering FIG. 2 as a plan view, a footprint of the architecture is defined by the combined floor area of the transport module 202, the process modules 206a and 206b, and the dual sided slot valves 204a. It may be understood that the floor areas of the transport module 202 and the process module 206a may be primarily dictated by considerations other than the manner in which the modules 202, 202b and 206a are sealed together for operations. The individual dual sided slot valves 204a define the manner in which the modules 202 and 206 are sealed together for operations, such that the footprint of each individual dual sided slot valve 204a becomes significant in attempts to reduce the footprint of the cluster architecture 200. Thus, to reduce the footprint of each individual dual sided slot valve 204a it is important to reduce the width W of each of the individual dual sided slot valve 204a as much as possible.

Figure 3:
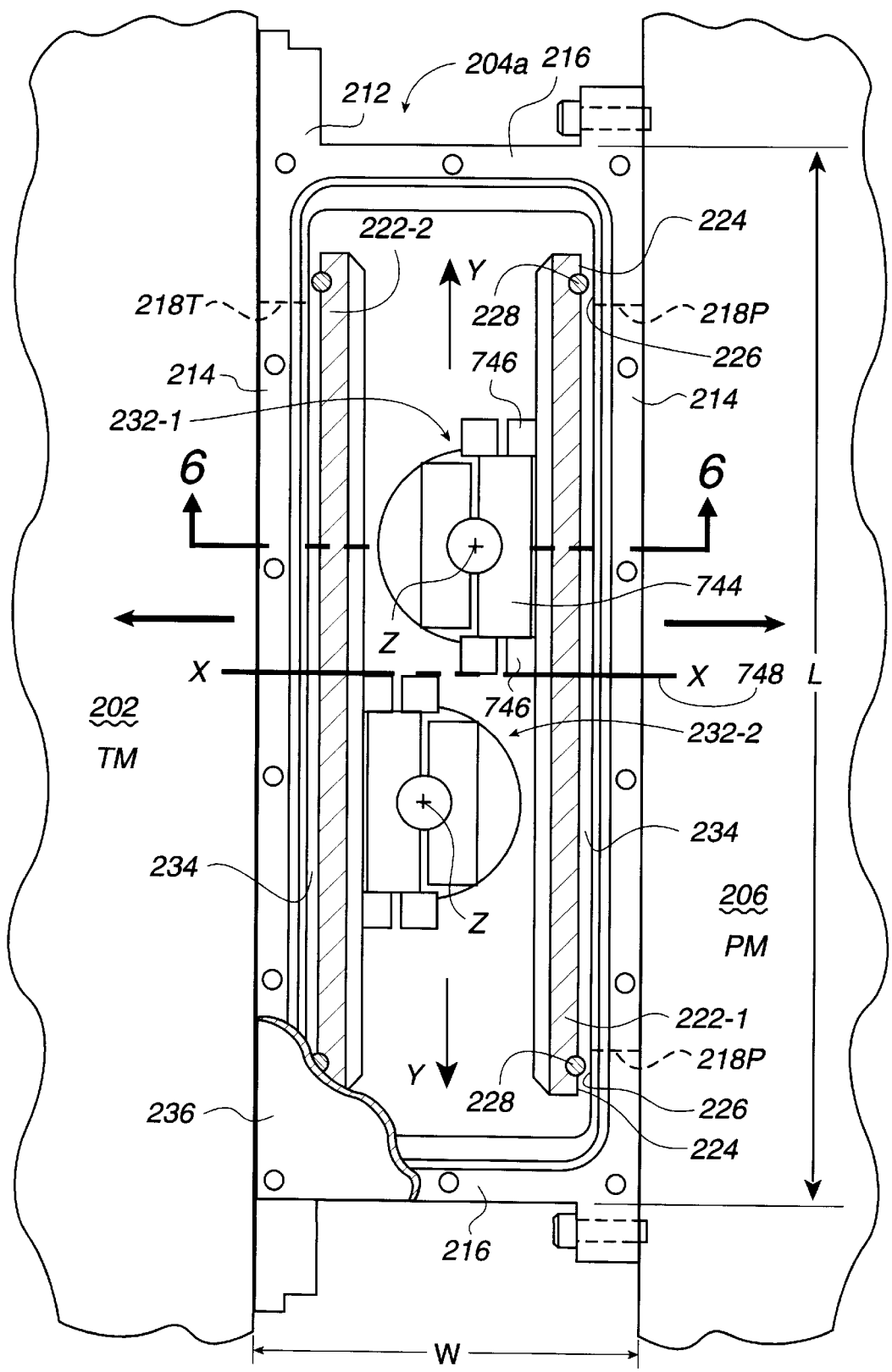
FIG. 3 is a plan view of a dual sided slot valve of the present invention showing the valve vacuum body having a width defined by opposite walls, and a slot in each wall to permit wafers to be transferred from a transport module to a process module, wherein each slot may be selectively closed by one of the two doors upon operation of one of two separate actuators to permit continued operations within the transport module while the process module is being serviced.

FIG. 3 shows one of the dual sided slot valves 204a of the invention as including a valve vacuum body 212 located between two modules of the cluster tool architecture. As shown, the two modules are the transport module 202 and one of the process modules 206, it being understood that valve vacuum body 212 may be located between any two modules of the cluster architecture. The valve vacuum body 212 has the width W defined by opposite walls 214. The side of the wall 214 nearest to the process module 206 may be referred to as the "PM side," whereas the side of the wall 214 nearest to the transport module 202 may be referred to as the "TM side." The valve vacuum body 212 has a length L defined by opposite end walls 216, where the width W times the length L defines the footprint of the individual dual sided slot valve 204a.

A port (or slot or opening) 218 is provided in each wall 214 to permit wafers (not shown), for example, to be transferred between one module and another module. As shown in FIG. 3, one such module is the transport module 202 and the other such module is the process module 206, with the slot 218P being adjacent to the process module 206 and the slot 218T being adjacent to the transport module 206. Each of the slots 218 is generally rectangular in shape and is smaller in each dimension than the generally rectangular shape of a door (or side door) 222 provided for closing the respective slot 218. In the case of the doors 222 and the slots 218, the corners are rounded, thus the respective rectangular shapes are referred to as "generally rectangular." Each of the doors 222 has a seal periphery 224 that overlaps an opposing seal surface 226 of the opposing wall 214 of the body 212. The seal periphery 224 may be provided with a seal device such as an O-ring 228 which is pressed against the seal surface 226 to provide an air-tight seal when the door 222 is in a CLOSED position as described below. Alternatively, a seal device may be vulcanized to the door 222, or another type of seal device having a replaceable seal may be used. The door 222-2 at the wall 214 forms a pressure seal between the transport module 202 and the process module 206. In this manner, the PM side may be vented to atmosphere while the TM side remains at vacuum. During normal operation of the modules 202 and 206 with both of the doors 222 closed, the combined seal periphery 224, opposing seal surface 226, and O-ring 228 allow the transport module 202 to run, or operate, at normal vacuum level (e.g., 80–100 mTorr) while the process module 206, for example, runs at process pressure. The valve 204a is also designed to allow the transport module 202 to be vented while the process module 206 is at vacuum, or to allow the process module 206 to be vented while the transport module 206 is at vacuum.

Referring to one of the doors 222, described as the door 222-1 and shown for example at the right as viewed in FIG. 3, the respective slot 218P may be selectively closed upon operation of one of two actuators 232. One of the actuators 232 corresponds to the door 222-1, is referred to as the actuator 232-1, and may be operated separately from the other actuator 232 that corresponds to the door 222-2 and that is referred to as the actuator 232-2. Such separate actuation permits, for example, continued operations within the transport module 202 while the process module 206a, for example, is being serviced. Therefore, only a selected one of the transport module 202 and the process module 206a need be shut down to enable servicing of the selected one of them. One result of actuation of the actuator 232 is to locate the door 222 in a CLOSED position, or in an OPEN position as shown in FIG. 3. In the OPEN position, the door 222 defines a space 234 between the door 222 and the wall 214. Another type of actuation of the actuator 232 is to locate the door 222 in either a DOWN or an UP position, which positions are along the Z-axis shown in FIG. 3.

Figure 4A:
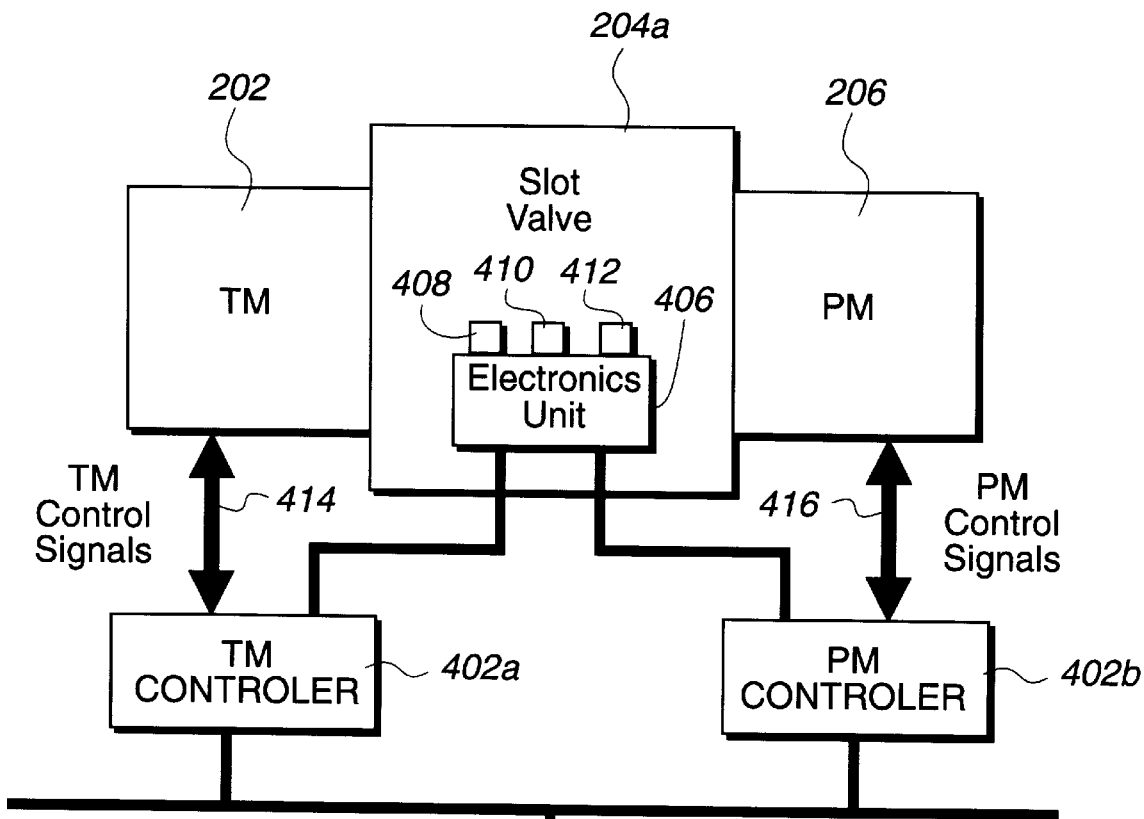
FIG. 4A is a schematic diagram of controllers for controlling the movements of a respective first door and a respective second door of the valve, wherein the controllers are coupled to a computer workstation that is used to operate the dual slot valve.
Figure 4B:
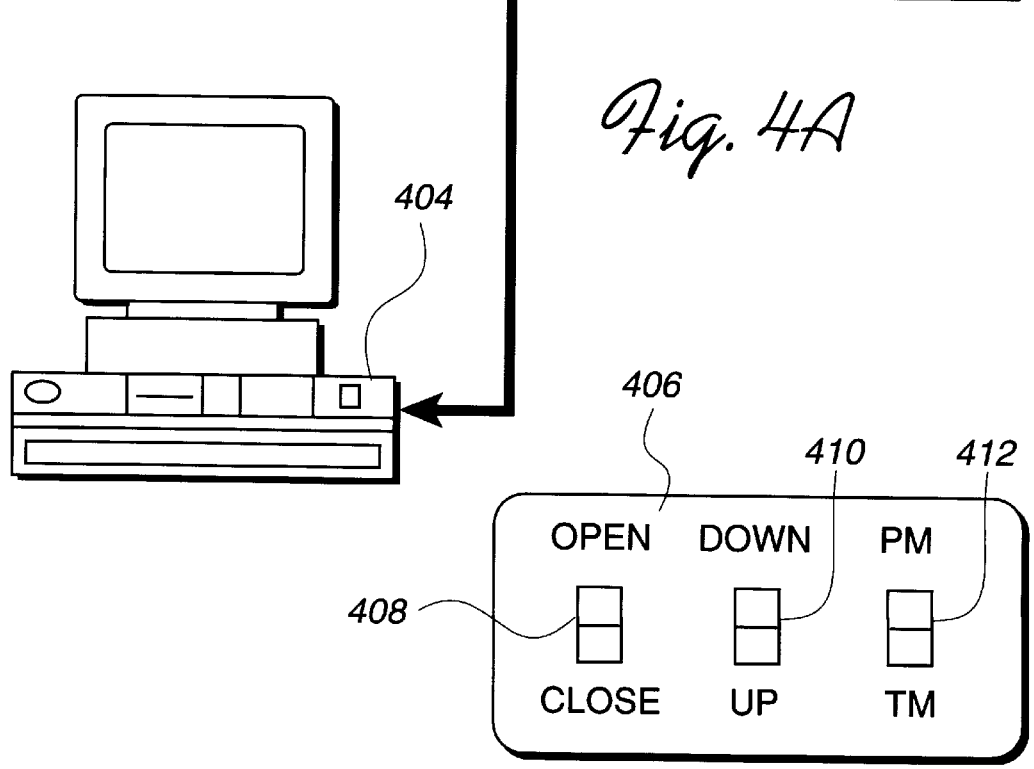
FIG. 4B depicts three switches for providing input to the controllers to facilitate controlling the movements of the first door and the second door of the valve.

FIG. 4A shows the transport module 202, the process module 206, and one of the dual sided slot valves 204a. A controller 402a is connected to, and controls, the operation of the transport module 202. The controller 402a is also connected to the TM side of the valve 204a for controlling the door 222-2. A controller 402b is connected to, and controls, the operation of the process module 206. The controller 402b is also connected to the PM side of the valve 204a for controlling the door 222-1. The controllers 402a and 402b are connected to a computer workstation, or tool controller, 404. The controllers 402a and 402b interface with the respective TM side and the PM side of the valve 204a via an electronics unit 406. FIG. 4B shows the top of the electronics unit 406 provided with a series of switches 408, 410, and 412, which are respectively for controlling the movement of the doors 222 into the OPEN and CLOSED positions, for controlling the movement of the doors 222 into the DOWN and UP positions, and for selecting which of the modules 202 and 206 is to be serviced (e.g., process module 206 is "PM"; and transport module 202 is "TM"). Examples of the signals 414 and 416 transmitted between respective ones of the controller 402a and 402b and the slot valve 204a are "Open Door," "Close Door," and "Door Enable."

Figure 5A:
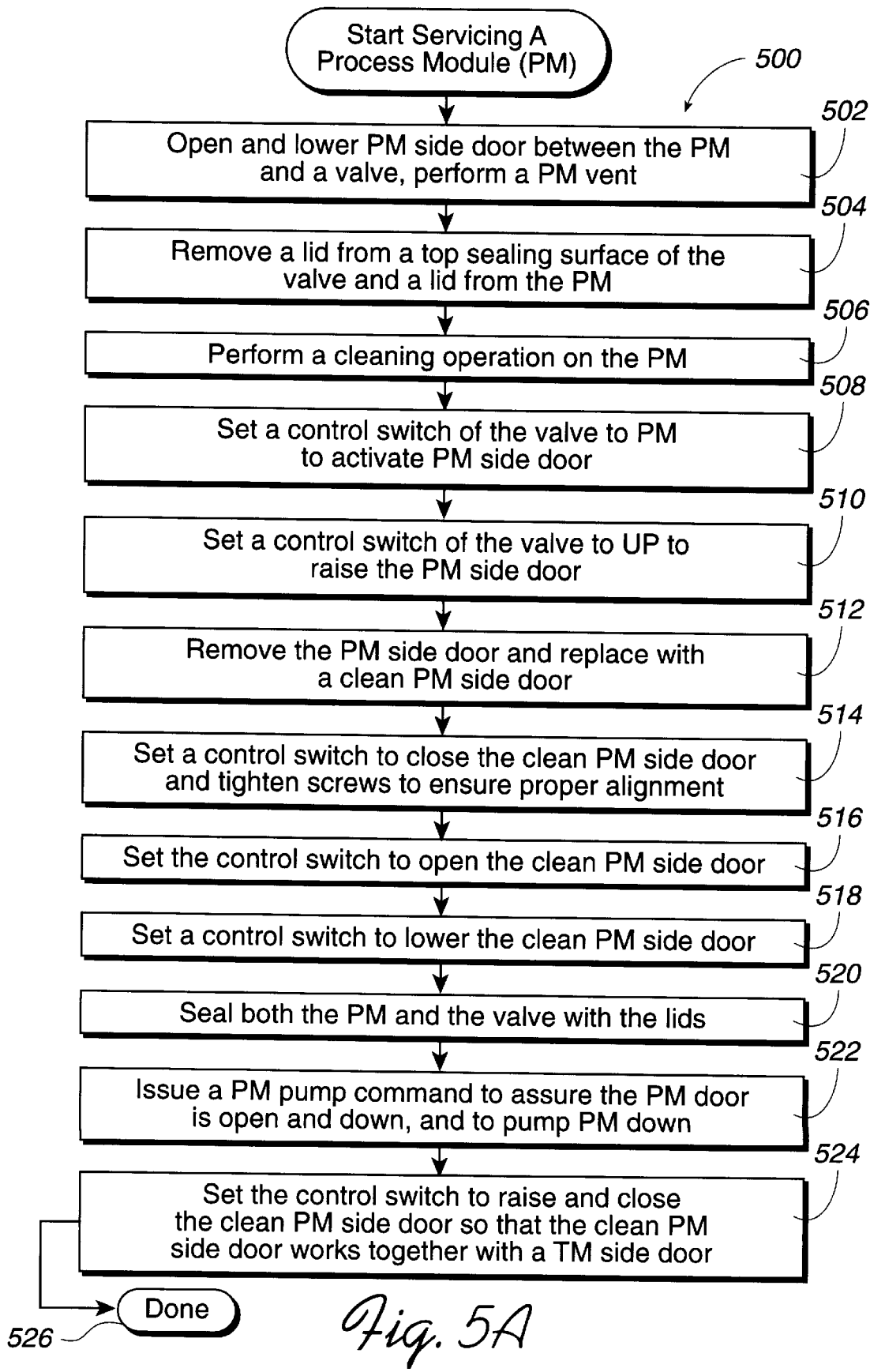
FIG. 5A depicts a flow chart illustrating the operations in a method of servicing a process module that operates in conjunction with the transport module, including controlling the movements of the first door and the second door of the valve to permit continued operations within the transport module while the process module is being serviced.
Figure 6A:
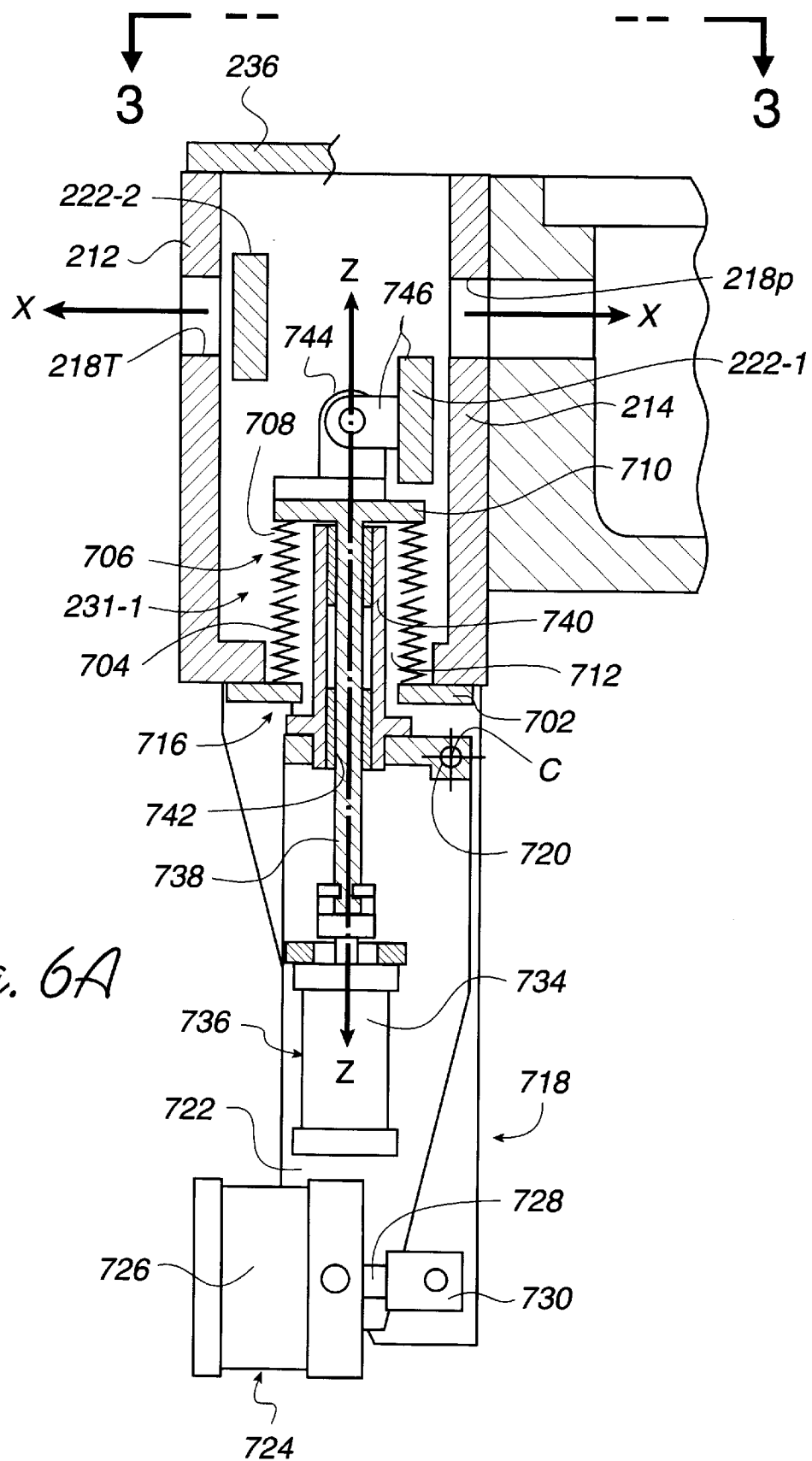
FIG. 6A is a vertical cross-sectional view taken along line 6—6 in FIG. 3 showing one of the two dual sided slot valves of the present invention in an OPEN and DOWN position, and showing one of the two actuators for closing one of the two doors, wherein the one actuator has two separately controllable motions to permit selected servicing operations to be performed on the process module, for example, while operations continue within the transport module.

FIG. 5A, viewed with FIG. 3, illustrates a flowchart 500 of method operations for servicing one of the process modules 206. An initial operation 502 causes the PM side door 222-1 to be opened and lowered as shown in FIG. 6A, thus bringing the valve body 212 to the same pressure as the process module 206. The process module 206 is then vented to atmospheric pressure. A next operation 504 is to remove lids 236 from the top of the valve vacuum body 212 and (not shown) from the process module 206a. Removal of the lid 236 (shown as a cut-away lid in FIG. 3) from the valve vacuum body 212 provides access to the interior of the valve vacuum body 212 as well as allowing manual access to the switches 408, 410 and 412. In an operation 506, a cleaning operation may be performed on the process module 206a. Such cleaning operation may include any of the above-noted service activities relating to a chamber. Then, in operation 508, the control switch 412 is set to "PM" to activate or condition the actuator 232-1 to operate the PM side door 222-1. In an operation 510, the control switch 410 is set to an UP position to cause the actuator 232-1 to raise the PM side door 222-1 from an initial DOWN position (away from the viewer in FIG. 3). Such raising moves the PM side door 222-1 toward the viewer in FIG. 3 to the UP position.

With the PM side door 222-1 in the UP position near the top of the valve vacuum body 212 (nearest the viewer in FIG. 3) and vertically aligned with the slot 218P, an operation 512 is performed to remove the PM side door 222-1 from the actuator 232-1. Such removal is by loosening fasteners (not shown) which normally secure the door 222-1 to the actuator 232-1. In the last aspects of the operation 512, a clean PM side door 222-1 is secured to the actuator 232-1. With the clean PM side door 222-1 in the UP and OPEN position toward the viewer in FIG. 3, a next operation 514 is to set the control switch 408 to the CLOSE switch position. This causes the actuator 232-1 to move the door 222-1 rightward as viewed in FIG. 3 such that the door 222-1 presses the O-ring 228 of the right door 222-1 against the seal surface 226. In initially securing the clean door 222-1 to the actuator 232-1, the fasteners (not shown) are left loose until the operation 514 is performed and the door 222-1 is moved to the right as described above. With the door 222-1 moved to the right so that the entire length of the O-ring 228 is compressed against the seal surface 226, such fasteners are tightly secured. In this manner, the tight securing by the fasteners is not performed until the door 222-1 is properly aligned with and sealed against the seal surface 226.

In an operation 516, the control switch 408 is set to an OPEN switch position to cause the actuator 232-1 to move the clean PM side door 222-1 to the OPEN position, whereupon in an operation 518, the control switch 410 is set to the DOWN position to cause the actuator 232-1 to lower the PM side door 222-1. Then, in an operation 520, the lids 236 are returned to both the process module 206 and to the valve vacuum body 212 to seal both units against the atmosphere. In an operation 522, a PM pump command is issued. This command causes the process module controller 402b to first make sure that the PM side door 222-1 is in the OPEN and DOWN positions. The process module 206 is then pumped down to a vacuum.

In operation 524 the control switches 410 and 408 are then set to the respective UP and CLOSE switch positions, causing the actuator 232-1 to raise the door 222 to the UP position. Upon completion of the raising portion of operation 524, the actuator 232-1 causes the door 222-1 to be moved to the right as viewed in FIG. 3 into the CLOSED position. As described above, such movement of the door 222-1 to the right causes the O-ring 228 to abut and be compressed by the seal surface 226 and effect a vacuum-tight seal. At this juncture, the clean PM side door 222-1 will work together with the opposite TM side door 222-2. The servicing of the process module 206 is DONE at operation 526.

Figure 5B:
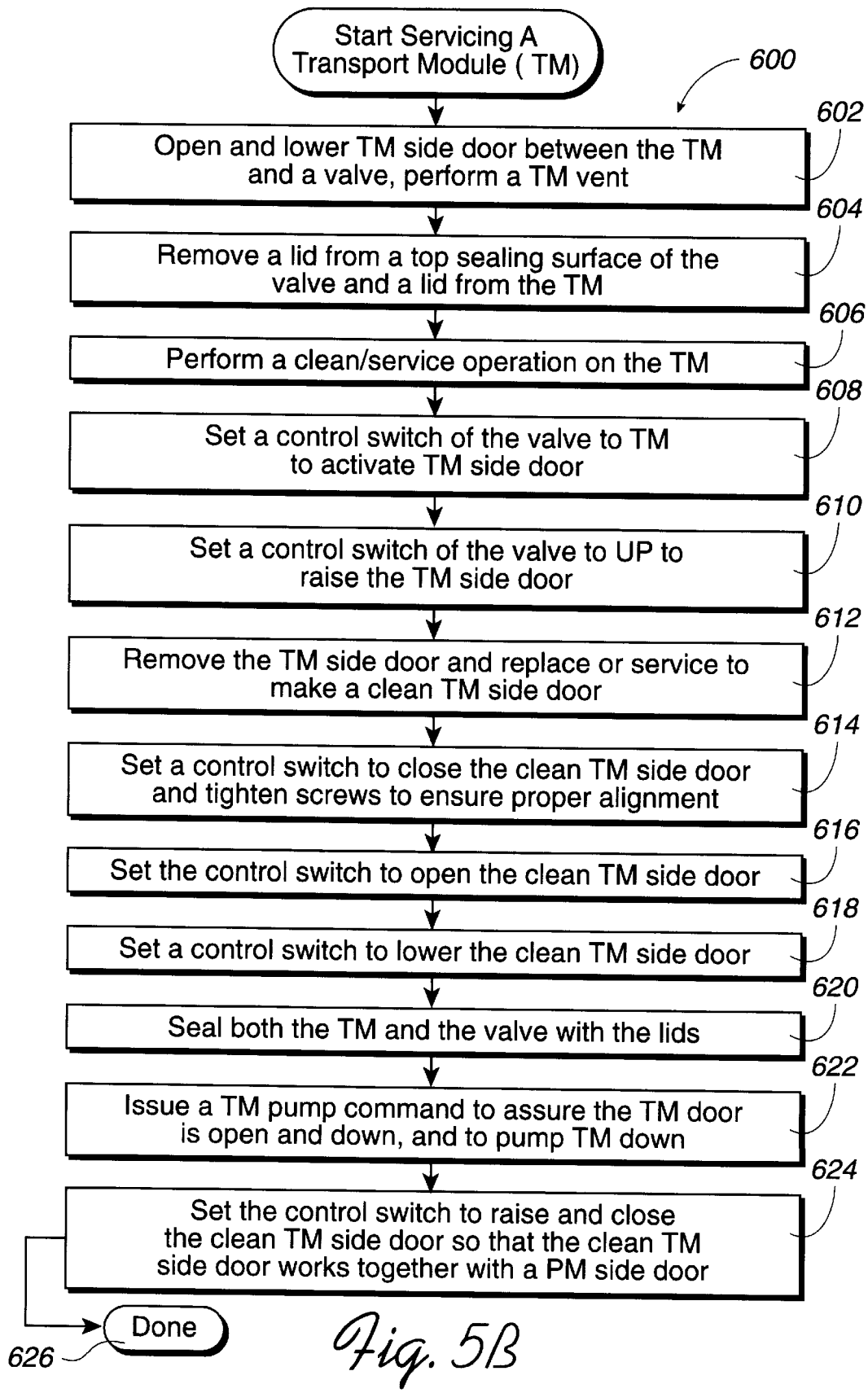
FIG. 5B depicts a flow chart illustrating the operations in a method of servicing a transport module that operates in conjunction with the process module, including controlling the movements of the first door and the second door of the valve to permit continued operations within the process module while the transport module is being serviced.

FIG. 5B, viewed with FIG. 3, illustrates a flowchart 600 of method operations for servicing one of the transport modules 206. An initial operation 602 causes the TM side door 222-2 to be opened and lowered, thus bringing the valve body 212 to the same pressure as the transport module 202. The transport module 202 is then vented to atmospheric pressure.

A next operation 604 is to remove the lids 236 from the top of the valve vacuum body 212 and (not shown) from the transport module 202. Removal of the lid 236 from the valve vacuum body 212 provides access to the interior of the valve vacuum body 212 as well as allowing manual access to the switches 408, 410 and 412. In an operation 606, a cleaning operation may be performed on the transport module 202. Such cleaning operation may include any of the above-noted service activities relating to a chamber. Then, in operation 608, the control switch 412 is set to "TM" to activate or condition the actuator 232-2 to operate the TM side door 222-2. In an operation 610, the control switch 410 is set to an UP switch position to cause the actuator 232-1 to raise the TM side door 222-2 from an initial DOWN position (away from the viewer in FIG. 3). Such raising moves the TM side door 222-2 toward the viewer in FIG. 3 to the UP position.

With the TM side door 222-2 in the UP position near the top of the valve vacuum body 212 (nearest the viewer in FIG. 3) and vertically aligned with the slot 218T, an operation 612 is performed to remove the TM side door 222-2 from the actuator 232-2. Such removal is also by loosening fasteners (not shown) which normally secure the door 222-2 to the actuator 232-2. In the last aspects of the operation 612, a clean TM side door 222-2 is secured to the actuator 232-2. With the clean TM side door 222-2 in the UP and OPEN position toward the viewer in FIG. 3, a next operation 614 is to set the control switch 408 to the CLOSE switch position. This causes the actuator 232-2 to move the door 222-2 to the left as viewed in FIG. 3 such that the door 222-2 presses the O-ring 228 of the left door 222-2 against the seal surface 226. As described with respect to the clean door 222-1, in initially securing the clean door 222-2 to the actuator 232-2, the fasteners (not shown) are left loose until the operation 614 is performed, the door 222-2 is moved to the left to compress the entire length of the O-ring 228 against the seal surface 226. The fasteners are tightly secured.

In an operation 616, the control switch 408 is set to an OPEN switch position to cause the actuator 232-2 to move the clean TM side door 222-2 to the OPEN position, whereupon in an operation 618, the control switch 410 is set to the DOWN position to cause the actuator 232-2 to lower the TM side door 222-2. Then, in an operation 620, the lids 236 are returned to both the transport module 202 and to the valve vacuum body 212 to seal both units against the atmosphere.

In an operation 622, a TM pump command is issued. This command causes the transport module controller 402a to first make sure that the TM side door 222-2 is in the OPEN and DOWN positions. The transport module 202 is then pumped down to a vacuum.

In operation 624 the control switch 408 is then set to the CLOSE switch position, causing the actuator 232-2 to, upon completion of the raising portion of operation 624, cause the door 222-2 to be moved to the left as viewed in FIG. 3 into the CLOSED position. Such movement of the door 222-2 to the left causes the O-ring 228 to abut and be compressed by the seal surface 226 and effect a vacuum-tight seal. At this juncture, the clean TM side door 222-2 will work together with the opposite PM side door 222-1. The servicing of the transport module 202 is DONE at operation 626.

As described above, the two actuators 232 include an actuator 232-1 corresponding to the door 222-1. The actuator 232-1 may be operated separately from the other actuator 232-2 that corresponds to the door 222-2. Each of the actuators 232 is the same as the other actuator 232, except for the rotational orientation of the door 222 carried by the respective actuator 232. In particular, the actuators 232-1 shown in FIG. 6A–6C, the doors 222-1 are on the right as viewed in FIGS. 6A–6C for operation with respect to the process module 206, for example. The actuators 232-2 shown in FIGS. 6D and 6E have the doors 222-2 on the left as viewed in FIGS. 6D and 6E for operation with respect to the transport module 202, for example. Thus, for efficiency of description, primary attention is directed to the actuator 232-1 shown in FIGS. 6A–6C, and additional details are described with respect to FIGS. 6D and 6E.

Figure 6B:
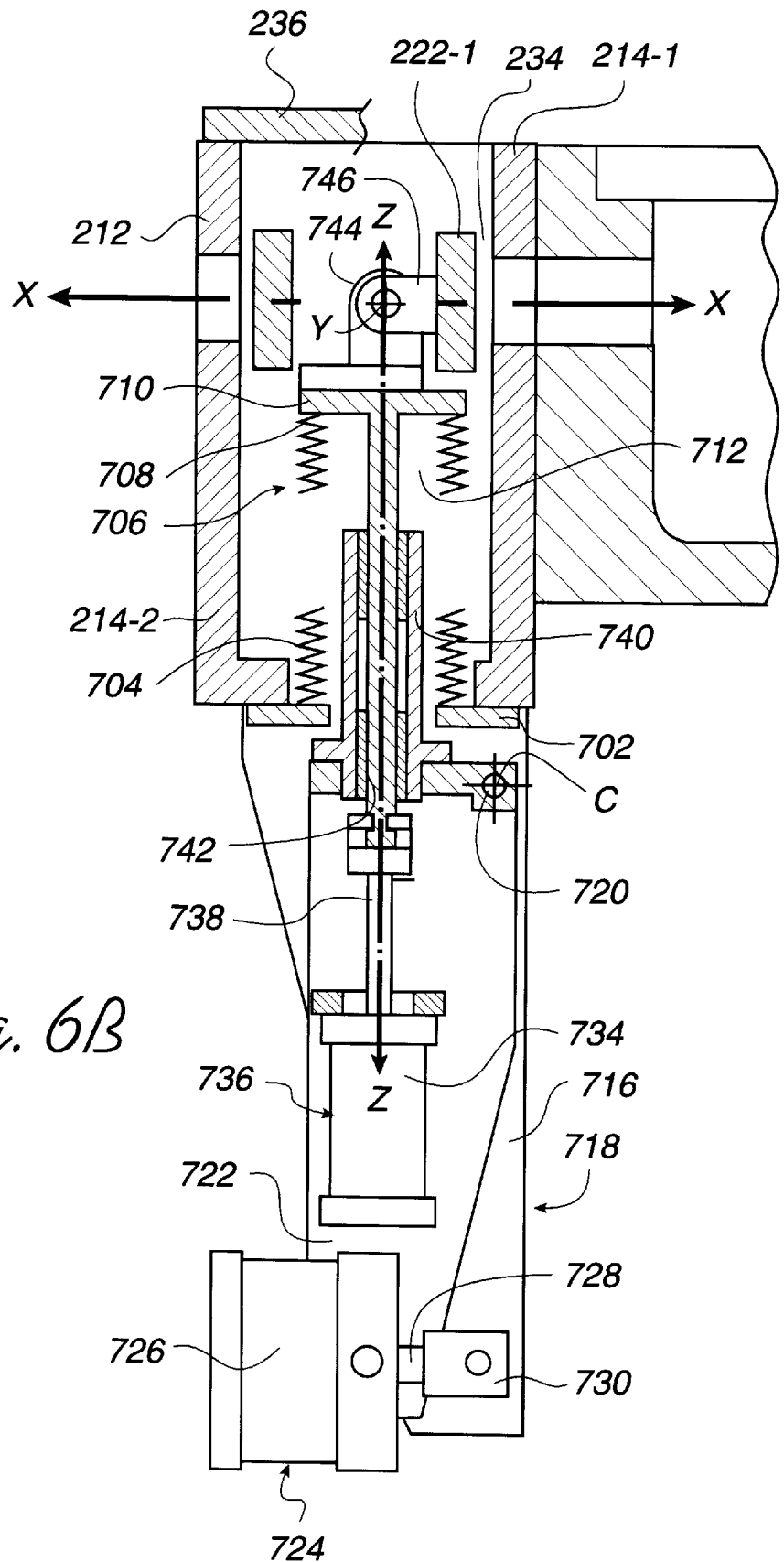
FIG. 6B is a vertical cross-sectional view similar to FIG. 6A showing the one valve of the present invention in an OPEN and UP position to facilitate servicing of the door associated with the one valve.
Figure 6C:
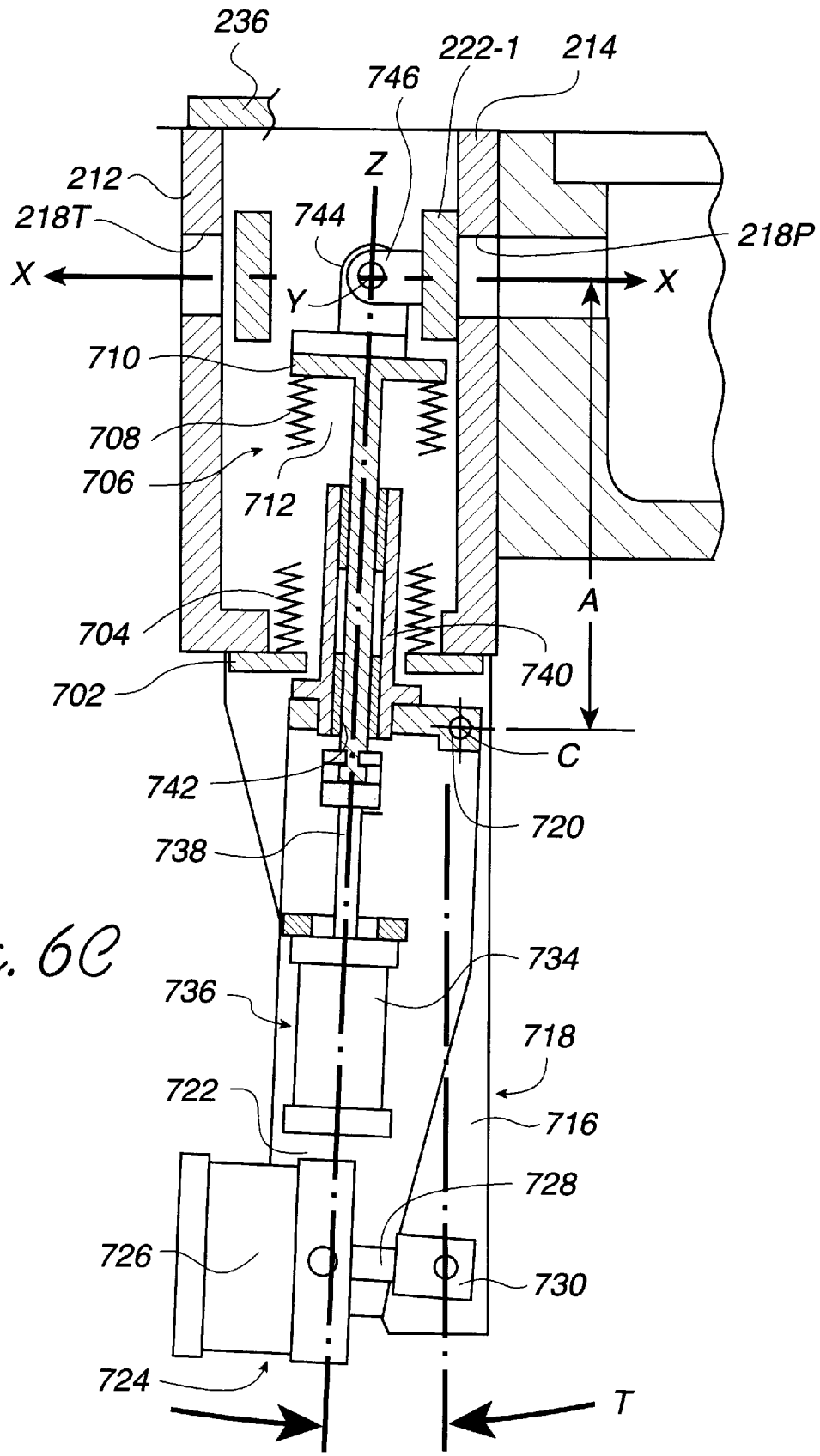
FIG. 6C is a vertical cross-sectional view similar to FIGS. 6A and 6B showing the one valve of the present invention in an UP and CLOSED position to close the slot associated with the one valve.
Figure 7:
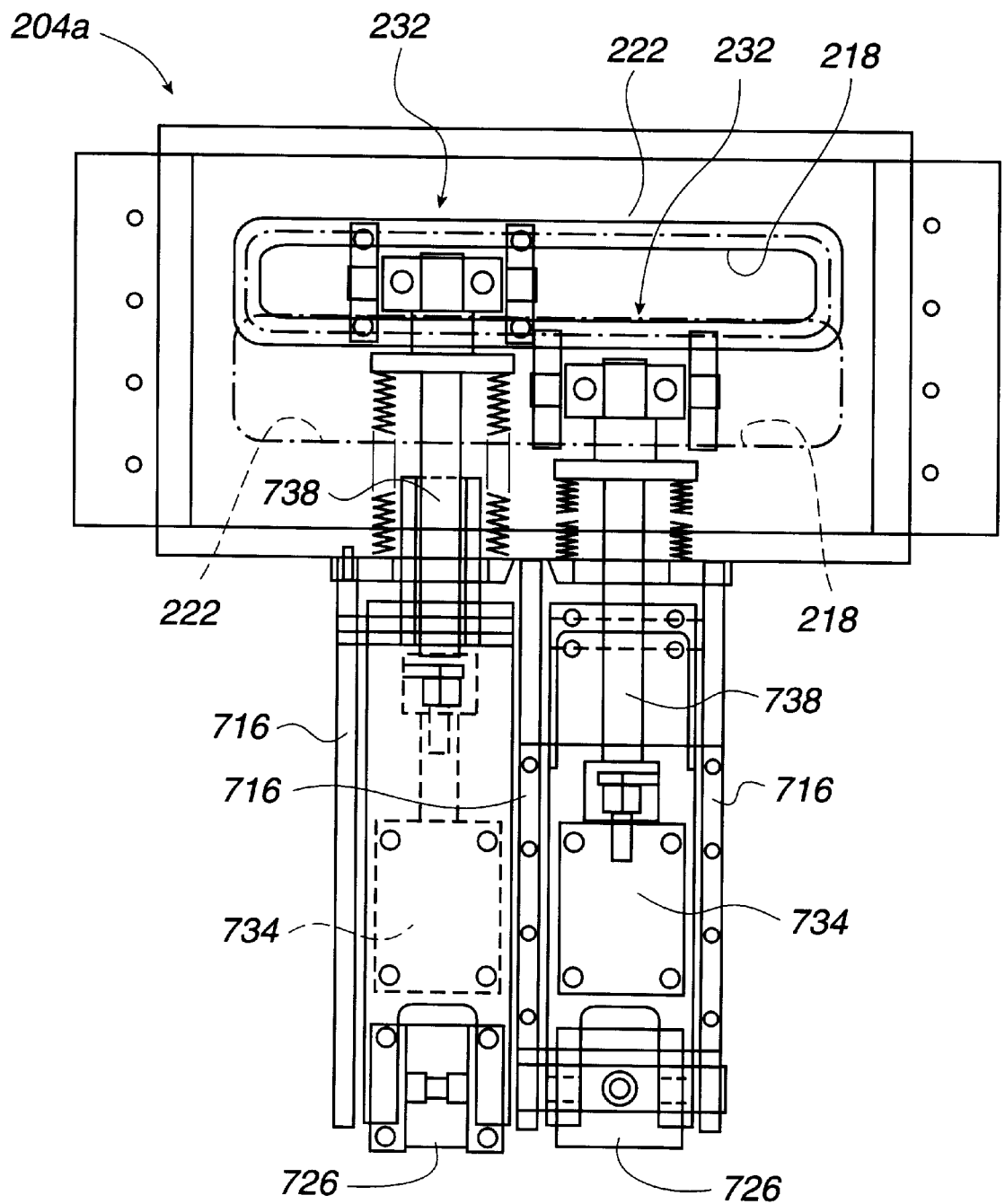
FIG. 7 is a schematic view taken along line 7—7 in FIG. 6D showing the actuator shafts for each slot valve offset in side-by-side relationship along the Y-axis so as to reduce the width of the valve vacuum body, and thus reduce the footprint of the semiconductor process cluster architecture that includes the dual sided slot valve of the present invention.

Referring to FIGS. 6A–6C, the X-axis designates the arcuate path along which the door 222-1 moves (e.g., in operation 516) from the CLOSED position shown in FIG. 6C to the left to the OPEN position shown in FIG. 6B. The X-axis may be generally perpendicular to the plane of the wall 214. Although the path of the doors 222-1 and 222-2 is arcuate relative to a cradle axis-C, the radius of the arc is large enough that the OPEN position of the door 222-1 may be said to be perpendicular to and away from the right side wall 214-1 of the body 212, and may be said to be perpendicular to and away from the left side wall 214-2 of the body 212. In the OPEN position, the door 222-1 defines the space 234 between the door 222-1 and the wall 214. With the door 222-1 in the OPEN position, the easy access to the valve 204 for service, as noted above, is provided. The advantage of initially allowing easy access to the valve 204 in the OPEN and UP position shown in FIG. 6D, which position is not vertically down (i.e., not laterally-spaced), relative to the right PM slot 218P is that in the OPEN and UP position the door 222-1 of the valve 204 may be reached by a gloved hand (not shown) of a service worker for service.

The Z-axis corresponds to the above-referenced vertical, or lateral, direction or spacing, and is also shown in FIGS. 6A–6C. The Z-axis is the axis of the actuator 232-1 along which the door 222-1 moves into the UP and DOWN positions relative to the PM port 218P. Comparing FIG. 6B to FIG. 6C, it may be appreciated that the Z-axis moves, and in particular, rotates on the cradle axis C from a vertical orientation (FIG. 6B) to a tipped orientation (FIG. 6C) at an angle T with respect to vertical. The change in orientation around the C-axis and the distance A from the C-axis to the door 222-1 result in the door 222-1 moving from the CLOSED position, FIG. 6C (at which the O-ring touches the seal surface 226), to the OPEN position, FIG. 6B, separated by the space 234 from the wall 214-1.

The actuator 231-1 includes the upper valve vacuum body 212 mounted on top of a bottom plate 702. The body 212 has the slots 218P and 218T aligned with the X-axis, and is adapted to be sealed by the lid 236. A lower end 704 of a bellows 706 is sealingly attached to the bottom plate 702 and an upper end 708 of the bellows 706 is sealingly attached to a bellows plate 710. With the bellows 706 sealed to the bottom plate 702 and to the bellows plate 710, and with the lid 236 sealed to the top of the valve vacuum body 212, the body 212 is strong enough to resist the forces of a vacuum applied through the slot 218P, for example. The bellows 706 has a hollow cylindrical shape defining a cavity 712.

The bottom plate 702 carries three spaced arms 716 of a first, or, pivot, frame 718. One arm 716 is shown in FIGS. 6A–6C extending downwardly from the bottom plate 702 below the bellows 706. Another one of the arms 716 extends parallel to the one arm 716 and supports a pivot pin 720 that is centered on the C-axis. The pivot pin 720 provides a rotary mount for a cradle 722 that is suspended from the pin 720 for rocking motion around the C-axis. The rocking motion is provided by a first pneumatic motor 724 having an open/close cylinder 726, and a piston rod 728. One end, a distal end 730, of the rod 728 is secured to the arms 716 so that when the rod 728 is retracted or extended the cradle 722 respectively rotates counterclockwise or clockwise on the C-axis. The retracted rod position shown in FIG. 6B corresponds to, and causes, the OPEN position of the door 222-1 (operation 516, for example) since the rod 728 causes the cradle 722 to rock counterclockwise on the pin 720. The extended rod position shown in FIG. 6C corresponds to, and causes, the CLOSED position of the door 222-1 (operation 522, for example) since the rod 728 causes the cradle 722 to rock clockwise on the pin 720.

The cradle 722 also supports an up/down cylinder 734 of a second, or up/down motor 736. With the cylinder 734 fixed to the cradle 722, a piston rod 738 may be extended or retracted and slides through a hollow guide tube 740 mounted in an aperture 742 of the cradle 722 adjacent to the pivot pin 720. The bellows 706 has the cavity 712 with a hollow cylindrical shape for receiving the piston rod 738 and the piston rod guide tube 740. As shown in FIGS. 6A–6C, the piston rod guide tube 740 allows the piston rod 738 of the second, or up/down, motor 736 to be extended or retracted and correspondingly move the bellows plate 710. The bellows plate 710 carries an actuator link 744 which supports a pair of door mount arms 746 for rotation on the Y-axis. The arms 746 are secured to the door 222-1 via the fasteners described (but not shown) above. The door mount arms 746 are attached to the door 222-1 off-center with respect to a mid-point of the door 222-1 (as best indicated by a line 748 in FIG. 3), such that neither of the doors 222-1 and 222-2 is centered about the longer side (or Y-axis dimension) of each respective door 222. As a result of the off-center mounting of the doors 222 to the actuators 232, the combined width of the actuators 232 may be substantially less than twice the diameter of any one of the actuators 232. In practice, the width W of the body 212 need only be about 6.625 inches, which is only a one hundred fifty percent (150%) increase in the width W as compared to the width of only one actuator 232.

It may be understood from FIGS. 6A and 6C that when the rod 738 of the up/down motor 736 is extended in operation 510, for example, the door 222-1 is in the UP position (FIG. 6C) with the bellows 706 extended to maintain the vacuum, for example, in the process module 206. When the rod 738 of the up/down motor 736 is retracted in operation 518, for example, the door 222-1 is moved into the DOWN position (FIG. 6A) with the bellows 706 retracted to maintain the vacuum, for example, in the process module 206.

It may be understood then, that the actuator 232, with the separate motors 724 and 736, operates to separately move the door 222-1 in the first direction of the X-axis generally perpendicular to the respective first and second walls 214-1 and 214-2 of the body 212, and to move the door 222-1 in a second direction generally parallel to the walls 214 of the body.

The unmet needs of the prior art cluster architecture 100 are filled by the above-described dual sided slot valve 204a in the vacuum body 212 between the adjacent modules 206 and 202. As described, the separate valve actuators 232 are provided for each of the two valve body slots 218, such that the slot 218 on one side of the body 212 may be separately closed or opened by one of the doors 222 independently of the other cooperating slot 218. The separate doors 222 and door actuation via the separate actuators 232-1 and 232-2 facilitate maintaining a vacuum, for example, in the transport module 202 while the adjacent process module 206a is opened to the atmosphere to allow servicing to be performed. As a result, substantial periods of downtime are avoided in that no pump down cycle is needed to bring the transport module 202 to a desired vacuum after servicing the process module 206a, and no other operations need be performed on the transport module 202 due to the servicing of the process module 206a.

Further, the dual sided slot valve 204a is provided with these advantages while initially allowing the easy access to the door 222 in the OPEN and UP position for performing service on the door 222. Such easy access is provided by the motors 724 and 736 which stop the door 222-1, for example, in the OPEN and UP position, but not vertically-spaced in the direction of the Y-axis relative to the slot 218P associated with the door 222-1. In the OPEN and UP positions the door 222 may be reached by a gloved hand of a service worker for service. The separate motor 736 then causes the door 222 to move laterally away from the OPEN and UP positions and away from the slot 218 to expose the sealing surface 234 around the slot 218, which permits cleaning of the sealing surface 234, for example. Due to the distance of the vertically-moved door 222 from the access opening (which is normally closed by the lid 236), it is very difficult for the glove of the worker to reach the door 222 in the DOWN position for service after the downward movement in the direction of the Y-axis. In the vertically-moved position (moved to the DOWN position), however, the door 222 does not interfere with the ability to clean around the valve door 222, including the surface 226 against which the door 222 seals. Additionally, the actuator shafts 738 for each of the doors 222 may be positioned relative to each other in the offset manner shown in FIG. 3 so as to reduce the distance, or width W, occupied by the valve vacuum body 212 between the adjacent transport and process modules 202 and 206, respectively, for example.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A dual slot valve for use in a semiconductor process cluster architecture arrangement, the dual slot valve comprising:
    a housing having a first side and a second side, the housing having a first slot at the first side and a second slot at the second side, the first slot being adjacent to a first wall surface of the housing, the second slot being adjacent to a second wall surface of the housing, a wafer transfer axis extending between the first and second slots and perpendicularly to the first and second wall surfaces, the wafer transfer axis being an axis along which a substrate is passed between a first module and a second module, the first module being attached to the first side of the housing and the second module being attached to the second side of the housing;
    a first door mounted for movement generally parallel to the wafer transfer axis and within the housing to enable movement of the first door between a closed position to close the first slot and an open position to open the first slot; and
    a second door mounted for movement generally parallel to the wafer transfer axis and within the housing to enable movement of the second door between a closed position to close the second slot and an open position to open the second slot.

2. A dual slot valve for use in a semiconductor process cluster architecture arrangement as recited in claim 1, wherein the open position of the first door is generally centered on the wafer transfer axis and away from the first wall surface of the housing, and wherein the open position of the second door is generally centered on the wafer transfer axis and away from the second wall surface of the housing.

3. A dual slot valve for use in a semiconductor process cluster architecture arrangement as recited in claim 2, further comprising:
    a door mechanism for moving one of the first and second doors into the respective open position, wherein door mechanism for the respective one of the first or the second doors includes two separate actuators, one of the actuators being effective to move the respective first or second door generally parallel to and centered on the wafer transfer axis between the open position and the closed position.

4. A dual slot valve for use in a semiconductor process cluster architecture arrangement as recited in claim 3, wherein one of the actuators for one of the doors moves the respective one of the doors in a first direction generally parallel to the wafer transfer axis to the respective open position, and another of the two actuators for the other one of the doors moves the respective other one of the doors in a second direction perpendicular to the wafer transfer axis and from the respective open position away from the respective first and second slots of the housing.

5. A dual slot valve for use in a semiconductor process cluster architecture arrangement as recited in claim 4, further comprising:
    the housing being provided with an opening adjacent to the wafer transfer axis and a lid normally closing the opening, with the lid off the opening access being provided to an interior of the housing;
    wherein the first direction is generally perpendicular to the respective first and second sides of the housing, and wherein the second direction is parallel to the first and second sides of the housing so that the movement of the respective door away from the respective first or second slots of the housing provides access to the respective wall surface of the housing through the opening when the lid is off.

6. A dual slot valve for use in a semiconductor process cluster architecture arrangement as recited in claim 1, further comprising:
    a controller for controlling the movement of the first door and of the second door.

7. A dual slot valve for use in a semiconductor process cluster architecture arrangement as recited in claim 6, wherein the controller is coupled to a computer workstation that is used to operate the dual slot valve.

8. A dual slot valve for use in a semiconductor process cluster architecture arrangement as recited in claim 3, wherein each of the doors has a short side and a long side, each of the doors thereby being elongated to overlap the respective slot, each of the doors having a center in the middle of the long side of the door, and wherein the door mechanism is attached to the first door and to the second door at respective locations that are off-centered with respect to the center of the long side of the respective slot, to thereby enable the valve housing to be compact.

9. A dual slot valve for use in a semiconductor process cluster architecture arrangement as recited in claim 3, wherein orthogonal X, Y and Z-axes are provided, and wherein the X-axis corresponds to the wafer transfer axis, and wherein each of the two separate actuators includes a first cylinder and a second cylinder, and the respective first cylinder is used to move the respective door between the open position and the closed position, the open and closed positions being generally along the X-axis, and the respective second cylinder is used to move the respective door between an up position and a down position, the up and down positions being generally along the Z-axis.

10. A dual slot valve for use in a semiconductor process cluster architecture arrangement as recited in claim 3, wherein each of the first and second doors is substantially rectangular having a longer side and a shorter side, wherein each of the doors is centered on a transverse axis that bisects the longer side, and wherein the door mechanism is attached to each of the first door and the second door at a separate location that is off-center with respect to the transverse axis, wherein the door mechanism attachment to the first door is at the location on one side of the transverse axis and the door mechanism attachment to the second door is at the location on an opposite side of the transverse axis so that a distance between the first side and the second side of the valve housing is reduced to render the housing compact.

11. In a semiconductor process cluster architecture, a method for operating a dual slot valve that is interfaced between a first module and a second module, the dual slot valve having a first slot and a second slot for passing a substrate between the first module and the second module, the method comprising the operations of:

providing a removable lid for an opening of the housing;
   defining a wafer transfer axis extending between the first and second slots and adjacent to the opening;
   providing a first door and a second door within the dual slot valve for enabling closure of the respective first and second slots;
   operating the first and second doors independently of each other to maintain the first door closed while permitting the second door to be open and adjacent to the wafer transfer axis to allow servicing of the second door of the valve; and
   removing the lid to provide access to an interior of the valve through the opening.

12. A method for operating a dual slot valve as recited in claim 11, further comprising the operations of:

controlling a position of the second door, the position being a removal position to enable removal of the second door through the opening and replacement of the second door with a clean second door, and wherein the second door in the removal position is spaced from the second slot of the dual slot valve along and aligned with the wafer transfer axis and thereby proximate to the opening so that upon the removal of the lid the removal and replacement of the second door are facilitated.

13. A method for operating a dual slot valve as recited in claim 11, further comprising the operations of:

controlling a position of the second door, the position being a cleaning position to enable cleaning of one or more of an inner wall surface of the dual slot valve or the second door, wherein the second door in the cleaning position is spaced from the second slot of the dual slot valve and from the wafer transfer axis and from the opening so that upon the removal of the lid the inner wall surfaces are exposed to facilitate the cleaning of the inner wall surfaces.

14. A dual slot valve for use in a semiconductor process cluster architecture arrangement provided with a process module and a transport module, the dual slot valve comprising:

a vacuum body having a first process module side and a second transport module side, the body having a process module slot at the first side and a transport module slot at the second side for passing a substrate between the process module and the transport module, the process module being attached to the first side of the body and the transport module being attached to the second side of the body, the first side of the body having a first wall surface and the second side of the body having a second wall surface;
   a first door defining a plane and being movably mounted within the body between an open position and a closed position to enable closure of the first slot, in the open position the plane of the first door being positioned along an axis that is generally perpendicular to the first wall surface of the body with the first door centered on the axis, the plane of the first door being away from the first wall surface in the open position, the first door being movably mounted within the body between an up position and a down position, in the down position the plane of the first door being parallel to and away from the first wall surface of the body and the first door being away from the axis to permit accessing of the first wall surface;
   a second door defining a plane and being movably mounted within the body between an open position and a closed position to enable closure of the second slot, in the open position the plane of the second door being positioned along the axis that is generally perpendicular to the second wall surface of the body with the second door centered on the axis, the second door being movably mounted within the body between an up position and a down position, in the down position the plane of the second door being parallel to and away from the second wall surface and the second door being away from the axis to permit accessing of the second wall surface; and
   a pair of separate actuators for each of the doors, each pair of the actuators comprising an open/closed motor for moving the respective door within the body between the open position and the closed position, and an up/down motor for moving the respective door within the body between the up position and the down position.

15. A dual slot valve for use in a semiconductor process cluster architecture arrangement as recited in claim 14, the valve further comprising:

a first controller for separately controlling the actuators for the first door;
   a second controller for separately controlling the actuators for the second door; and
   a computer workstation connected to the first and second controllers for enabling the first door to be in other than the closed position for servicing the process module at the same time as the second door is in the closed position to allow the transport module to operate other than in a service mode.

16. A dual slot valve for use in a semiconductor process cluster architecture arrangement as recited in claim 15, the workstation further comprising:

a computer program comprising instructions for the computer workstation to cause the controllers to operate one of the actuators and move the first door to vent the body through the process module, and to move the first door to the up position to enable replacement of the first door with a clean door.

17. A dual slot valve for use in a semiconductor process cluster architecture arrangement, the dual slot valve comprising:

- a housing having a first side and a second side, the housing having a first slot at the first side and a second slot at the second side, the first slot being adjacent to a first wall surface of the housing, the second slot being adjacent to a second wall surface of the housing, a wafer transfer axis extending between the first and second slots and perpendicularly to the first and second wall surfaces, the wafer transfer axis being an axis along which a substrate is passed between a first module and a second module, the first module being attached to the first side of the housing and the second module being attached to the second side of the housing;
- a first door mounted for movement generally parallel to the wafer transfer axis and within the housing to enable movement of the first door between a closed position to close the first slot and an open position to open the first slot;
- a second door mounted for movement generally parallel to the wafer transfer axis and within the housing to enable movement of the second door between a closed position to close the second slot and an open position to open the first slot;
- a first actuator attached to the first door for moving the first door into the respective open position; and
- a second actuator attached to the second door for moving the second door into the respective open position;
- the locations of the attachments of the first and second actuators to the respective first and second doors being offset from each other so that the valve housing is more compact than if the locations were not offset.

18. A dual slot valve for use in a semiconductor process cluster architecture arrangement, the dual slot valve comprising:

- a housing having a first side and a second side, the housing having a first slot at the first side and a second slot at the second side, the first slot being adjacent to a first wall surface of the housing, the second slot being adjacent to a second wall surface of the housing, a wafer transfer axis extending between the first and second slots and perpendicularly to the first and second wall surfaces, the wafer transfer axis being an axis along which a substrate is passed between a first module and a second module, the first module being attached to the first side of the housing and the second module being attached to the second side of the housing;
- a first door mounted for movement generally parallel to the wafer transfer axis and within the housing to enable movement of the first door between a closed position to close the first slot and an open position to open the first slot;
- a second door mounted for movement generally parallel to the wafer transfer axis and within the housing to enable movement of the second door between a closed position to close the second slot and an open position to open the first slot;
- each of the doors having a short side and a long side, each of the doors having a center in the middle of the long side of the respective door;
- a first actuator attached to the first door on one side of the respective center for moving the first door into the respective open position; and
- a second actuator attached to the second door on the other side of the respective center for moving the second door into the respective open position;
- the locations of the attachments of the first and second actuators to the respective first and second doors being effective to offset the actuators from each other so that the valve housing is more compact than if the locations were not offset.

* * * * *